(12) United States Patent
Masuda et al.

(10) Patent No.: US 8,829,605 B2
(45) Date of Patent: *Sep. 9, 2014

(54) SEMICONDUCTOR DEVICE HAVING DEEP AND SHALLOW TRENCHES

(71) Applicant: Sumitomo Electric Industries, Ltd., Osaka (JP)

(72) Inventors: Takeyoshi Masuda, Osaka (JP); Keiji Wada, Osaka (JP); Toru Hiyoshi, Osaka (JP); Shinji Matsukawa, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/680,798

(22) Filed: Nov. 19, 2012

(65) Prior Publication Data
US 2013/0153926 A1 Jun. 20, 2013

Related U.S. Application Data

(60) Provisional application No. 61/577,953, filed on Dec. 20, 2011.

(30) Foreign Application Priority Data

Dec. 20, 2011 (JP) ................................. 2011-277862

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 29/15* | (2006.01) | |
| *H01L 31/0312* | (2006.01) | |
| *H01L 29/78* | (2006.01) | |
| *H01L 29/66* | (2006.01) | |

(52) U.S. Cl.
CPC ...... *H01L 29/7802* (2013.01); *H01L 29/66712* (2013.01)
USPC ............. 257/330; 257/77; 257/329; 257/331; 257/332; 257/333; 257/334; 257/E29.257; 257/E29.26

(58) Field of Classification Search
CPC .......................... H01L 29/7813; H01L 29/7825
USPC ............... 257/77, 329–334, E29.257, E29.26
IPC ...................................... H01L 29/7813, 29/7825
See application file for complete search history.

(56) References Cited

U.S. PATENT DOCUMENTS

| | | | |
|---|---|---|---|
| 5,915,180 A | | 6/1999 | Hara et al. |
| 5,945,708 A | * | 8/1999 | Tihanyi ........................ 257/331 |

(Continued)

FOREIGN PATENT DOCUMENTS

| | | | |
|---|---|---|---|
| JP | 2-156678 A | | 6/1990 |
| JP | 9-074193 A | | 3/1997 |

(Continued)

OTHER PUBLICATIONS

Nakano et al., "690V, 1.00 mΩcm² 4H-SiC Double-Trench MOSFETs," 2011 International Conference on Silicon Carbide and Related Materials Abstract Book, p. 147 (Sep. 11, 2011).

(Continued)

*Primary Examiner* — Ida M Soward
(74) *Attorney, Agent, or Firm* — Venable LLP; Michael A. Sartori; George L. Howarah

(57) ABSTRACT

A MOSFET includes: a substrate made of silicon carbide and having a first trench and a second trench formed therein, the first trench having an opening at the main surface side, the second trench having an opening at the main surface side and being shallower than the first trench; a gate insulating film; a gate electrode; and a source electrode disposed on and in contact with a wall surface of the second trench. The substrate includes a source region, a body region, and a drift region. The first trench is formed to extend through the source region and the body region and reach the drift region. The second trench is formed to extend through the source region and reach the body region.

9 Claims, 6 Drawing Sheets

(56) References Cited

U.S. PATENT DOCUMENTS

| | | | |
|---|---|---|---|
| 5,976,936 A | 11/1999 | Miyajima et al. | |
| 6,020,600 A | 2/2000 | Miyajima et al. | |
| 6,054,752 A | 4/2000 | Hara et al. | |
| 6,573,534 B1 | 6/2003 | Kumar et al. | |
| 6,608,350 B2* | 8/2003 | Kinzer et al. | 257/341 |
| 6,649,975 B2* | 11/2003 | Baliga | 257/330 |
| 7,348,256 B2* | 3/2008 | Miller, Jr. et al. | 438/435 |
| 7,453,119 B2* | 11/2008 | Bhalla et al. | 257/330 |
| 7,459,365 B2* | 12/2008 | Rub et al. | 438/268 |
| 7,514,743 B2* | 4/2009 | Yang | 257/330 |
| 8,143,124 B2* | 3/2012 | Challa et al. | 438/270 |
| 8,247,865 B2* | 8/2012 | Hirler | 257/339 |
| 8,274,109 B2* | 9/2012 | Zundel | 257/328 |
| 8,354,711 B2* | 1/2013 | Zeng et al. | 257/330 |
| 8,390,060 B2* | 3/2013 | Darwish et al. | 257/330 |
| 8,492,226 B2* | 7/2013 | Mathew et al. | 438/270 |
| 8,519,473 B2* | 8/2013 | Meiser et al. | 257/329 |
| 2007/0187751 A1* | 8/2007 | Hu et al. | 257/330 |
| 2009/0114969 A1 | 5/2009 | Suzuki et al. | |
| 2009/0230404 A1 | 9/2009 | Masuda et al. | |
| 2010/0171173 A1* | 7/2010 | Hsieh | 257/333 |
| 2011/0081756 A1* | 4/2011 | Kobayashi | 438/270 |
| 2011/0121316 A1* | 5/2011 | Harada | 257/77 |
| 2011/0254084 A1* | 10/2011 | Terrill et al. | 257/330 |
| 2011/0260242 A1* | 10/2011 | Jang | 257/331 |
| 2012/0037922 A1 | 2/2012 | Kono et al. | |
| 2013/0181229 A1* | 7/2013 | Masuda et al. | 257/77 |
| 2013/0341712 A1* | 12/2013 | Burke et al. | 257/333 |

FOREIGN PATENT DOCUMENTS

| | | |
|---|---|---|
| JP | 2005-340685 A | 12/2005 |
| JP | 2009-043966 A | 2/2009 |
| JP | 2009-117593 A | 5/2009 |
| JP | 2010-238738 A | 10/2010 |
| JP | 2013-012590 | 1/2013 |

OTHER PUBLICATIONS

International Search Report and Written Opinion in International Patent Application No. PCT/JP2012/078802 dated Feb. 12, 2013.
International Search Report and Written Opinion in PCT International Application No. PCT/JP2012/080822 dated Feb. 12, 2013.
Office Action in U.S. Appl. No. 13/709,915, dated Apr. 25, 2014.

* cited by examiner

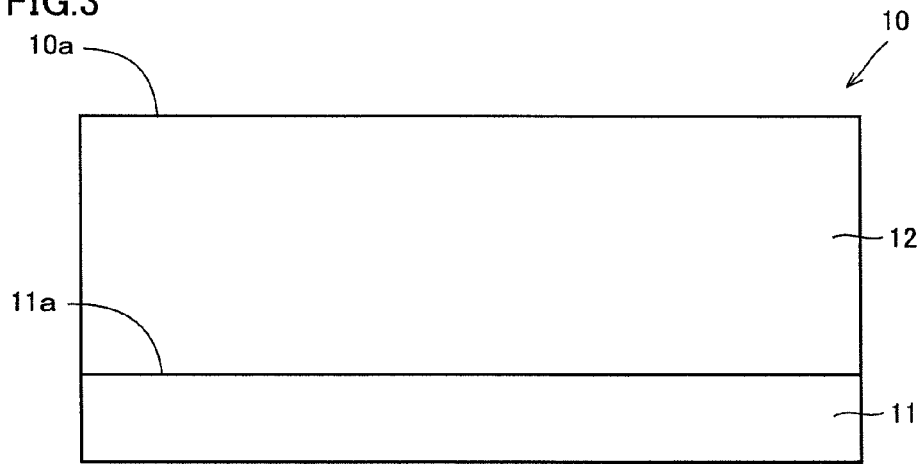
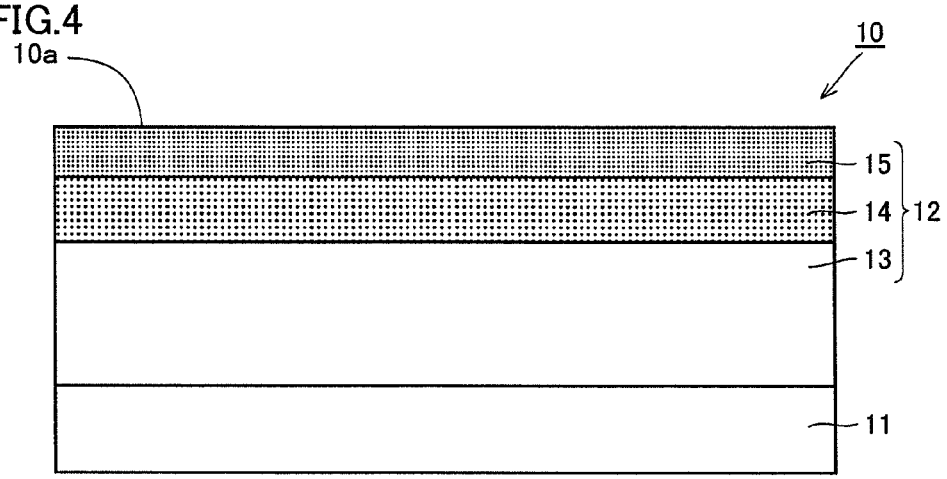
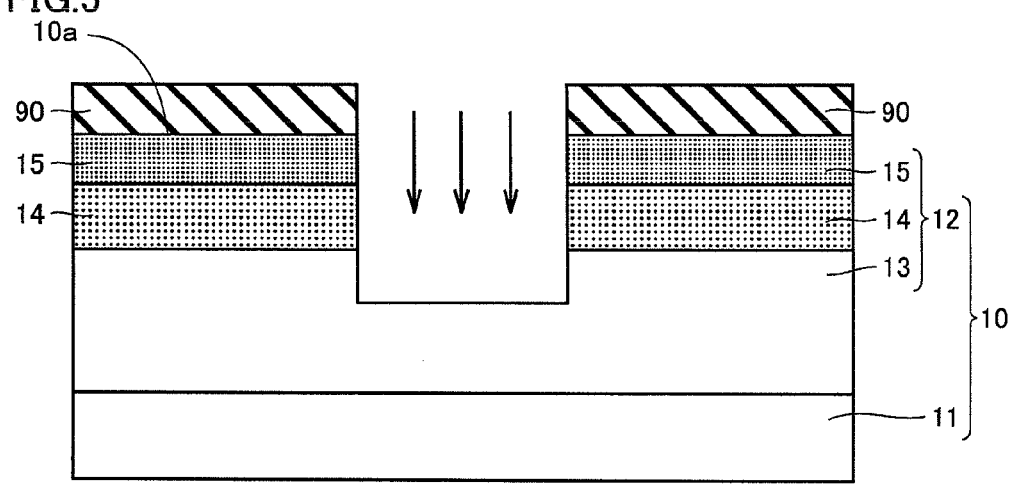

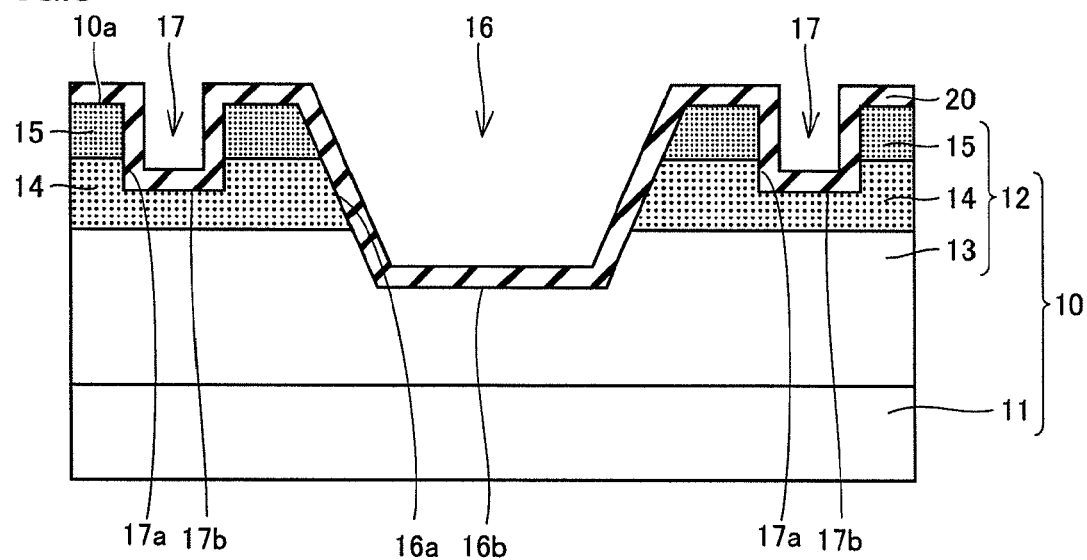
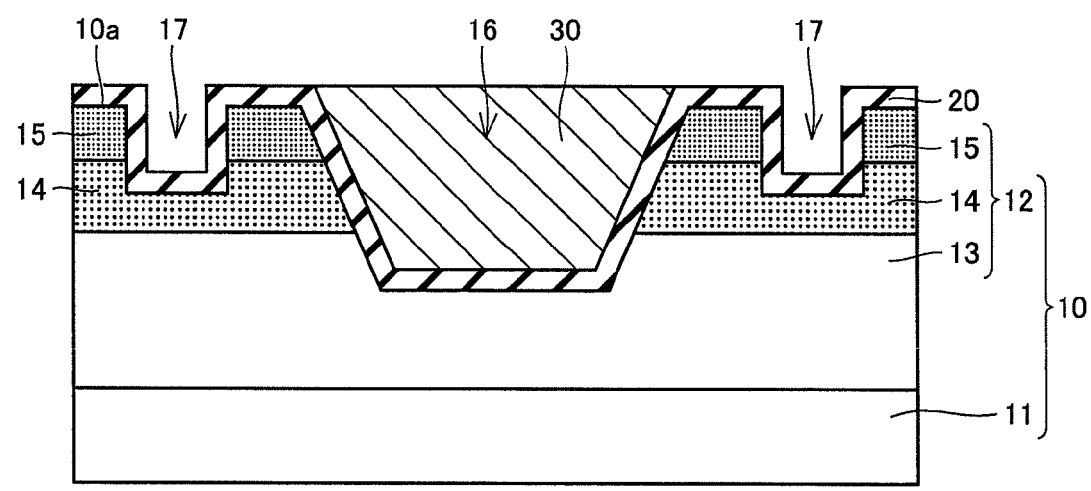

SEMICONDUCTOR DEVICE HAVING DEEP AND SHALLOW TRENCHES

BACKGROUND OF THE INVENTION

1. Field of the Invention

The present invention relates to a semiconductor device and a method for manufacturing the semiconductor device, more particularly, a semiconductor device in which decrease of breakdown voltage property is suppressed and response speed is improved, as well as a method for manufacturing such a semiconductor device.

2. Description of the Background Art

In recent years, in order to achieve high breakdown voltage, low loss, and the like in a semiconductor device, silicon carbide has been adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like.

An exemplary semiconductor device adopting silicon carbide as its material is a MOSFET (Metal Oxide Semiconductor Field Effect Transistor) or the like. The MOSFET is a semiconductor device that controls existence/non-existence of an inversion layer in a channel region in accordance with a predetermined threshold voltage so as to conduct and interrupt a current. For example, a trench gate type MOSFET or the like has been considered. A feature of the trench gate type MOSFET lies in formation of the channel region along a wall surface of the trench (for example, see Japanese Patent Laying-Open No. 9-74193 (Patent Literature 1)). In the trench gate type MOSFET, on-resistance can be reduced, but breakdown voltage property is disadvantageously decreased due to electric field concentration in the bottom portion of the trench. To address this, for example, there is proposed a MOSFET or the like having a trench in which a source electrode is disposed, apart from the trench in which the gate electrode is disposed (for example, see Y. Nakano, R. Nakamura, H. Sakairi, S. Mitani, T. Nakamura, "690V, 1.00 mΩcm² 4H—SiC Double-Trench MOSFETs", International Conference on Silicon Carbide and Related Materials Abstract Book, (United States), Sep. 11, 2011, p. 147 (Non-Patent Literature 1)).

In the MOSFET proposed in Patent Literature 1, the source electrode is in contact with a source region, and is connected to a body region via a contact region adjacent to the source region. Accordingly, for example, when switching the operating state of the MOSFET (from ON state to OFF state), injection of holes from the source electrode to the body region is hindered due to an influence of a depletion layer extending from a pn junction between the source region and the contact region. This results in decreased response speed of the MOSFET, disadvantageously.

In the MOSFET proposed in Non-Patent Literature 1, a contact surface between the source electrode and the substrate is formed close to the drain electrode relative to the bottom surface of the trench. Accordingly, a metal composing the source electrode is readily diffused into the drift region, whereby stacking faults extend from the contact surface to the drift region. As a result, the breakdown voltage property of the MOSFET is decreased, disadvantageously.

SUMMARY OF THE INVENTION

The present invention has been made in view of the foregoing problem, and has its object to provide a semiconductor device in which decrease of breakdown voltage property is suppressed and response speed is improved, as well as a method for manufacturing such a semiconductor device.

A semiconductor device according to the present invention includes: a substrate made of silicon carbide and having a first trench and a second trench formed therein, the first trench having an opening at a side of one main surface, the second trench having an opening at the side of the main surface and being shallower than the first trench; a gate insulating film disposed on and in contact with a wall surface of the first trench; a gate electrode disposed on and in contact with the gate insulating film; and a contact electrode disposed on and in contact with a wall surface of the second trench. The substrate includes: a source region including the main surface of the substrate and the wall surface of the first trench; a body region making contact with the source region and including the wall surface of the first trench; and a drift region making contact with the body region and including the wall surface of the first trench. The first trench is formed to extend through the source region and the body region and reach the drift region. The second trench is formed to extend through the source region and reach the body region.

In the semiconductor device according to the present invention, the contact electrode is disposed on and in contact with the wall surface of the second trench that extends through the source region and that reaches the body region. Hence, the contact electrode makes contact with the body region via no contact region. Accordingly, in the semiconductor device according to the present invention, holes or electrons can be injected from the contact electrode to the body region without influence of a depletion layer extending from a pn junction between the source region and the contact region. Accordingly, the operating state of the semiconductor device can be readily switched, thereby improving response speed of the semiconductor device. Further, in the semiconductor device according to the present invention, the second trench is formed to be shallower than the first trench. Accordingly, in the drift region under the first trench, defects resulting from diffusion of the metal composing the contact electrode are suppressed from extending, thereby suppressing decrease of breakdown voltage of the semiconductor device. Thus, according to the semiconductor device in the present invention, there can be provided a semiconductor device in which decrease of breakdown voltage property is suppressed and response speed is improved.

In the semiconductor device, the contact electrode may be disposed not to be on and in contact with the main surface of the substrate. Accordingly, short circuit between the contact electrode and the gate electrode can be readily avoided.

In the semiconductor device, the wall surface of the second trench may be constituted of a plane crossing a {0001} plane. Accordingly, the metal composing the contact electrode can be readily diffused into the substrate, thereby further reducing contact resistance between the contact electrode and the substrate.

In the semiconductor device, in a cross section in a thickness direction of the substrate including the first and second trenches, a fictitious straight line extending from the wall surface at a lowermost portion of the second trench in parallel with a {0001} plane may cross the wall surface of the first trench facing the second trench. As a result, decrease of breakdown voltage property of the semiconductor device can be suppressed more effectively.

In the semiconductor device, in the cross section in the thickness direction of the substrate including the first and second trenches, the fictitious straight line may cross the wall surface of the first trench facing the second trench, without crossing the drift region. As a result, decrease of breakdown voltage property of the semiconductor device can be suppressed further effectively.

In the semiconductor device, the main surface of the substrate may be constituted of a plane having an off angle of 8° or smaller relative to a {0001} plane. In this way, a substrate made of silicon carbide can be more readily prepared.

In the semiconductor device, the wall surface of the first trench may form an obtuse angle relative to the main surface of the substrate. Accordingly, on-resistance of the semiconductor device can be further reduced.

In the semiconductor device, the wall surface of the first trench may be constituted of a plane having an off angle of not less than 50° and not more than 65° relative to a {0001} plane. Accordingly, channel mobility of the semiconductor device can be improved more.

In the semiconductor device, the body region may have an impurity concentration of not less than $1.0 \times 10^{17}$ cm$^{-3}$. In this way, contact resistance between the contact electrode and the body region can be further reduced. Further, the body region may have an impurity concentration of not more than $5.0 \times 10^{18}$ cm$^{-3}$. Thus, the impurity concentration in the body region can be set to fall within a range with which decrease of crystallinity of the substrate made of silicon carbide can be avoided.

A method for manufacturing a semiconductor device in the present invention includes the steps of: preparing a substrate made of silicon carbide and having a main surface; forming an active region in the substrate; forming a first trench having an opening at a side of the main surface of the substrate; forming a second trench having an opening at the side of the main surface of the substrate and shallower than the first trench; disposing a gate insulating film on and in contact with a wall surface of the first trench; disposing a gate electrode on and in contact with the gate insulating film; and disposing a contact electrode on and in contact with a wall surface of the second trench. In the step of forming the active region, a source region, a body region, and a drift region are formed, the source region including the main surface of the substrate, the body region making contact with the source region, the drift region making contact with the body region. In the step of forming the first trench, the first trench having the wall surface is formed to extend through the source region and the body region, reach the drift region, and expose the source region, the body region, and the drift region. In the step of forming the second trench, the second trench is formed to extend through the source region and reach the body region.

According to the method for manufacturing the semiconductor device in the present invention, there can be manufactured the semiconductor device according to the present invention in which decrease of breakdown voltage property is suppressed and response speed is improved.

As apparent from the description above, according to the semiconductor device and the method for manufacturing the semiconductor device in the present invention, there can be provided a semiconductor device in which decrease of breakdown voltage property is suppressed and response speed is improved, as well as a method for manufacturing such a semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a schematic cross sectional view for illustrating the method for manufacturing the MOSFET.

FIG. 4 is a schematic cross sectional view for illustrating the method for manufacturing the MOSFET.

FIG. 5 is a schematic cross sectional view for illustrating the method for manufacturing the MOSFET.

FIG. 8 is a schematic cross sectional view for illustrating the method for manufacturing the MOSFET.

FIG. 9 is a schematic cross sectional view for illustrating the method for manufacturing the MOSFET.

DESCRIPTION OF THE PREFERRED EMBODIMENTS

Figure 1:
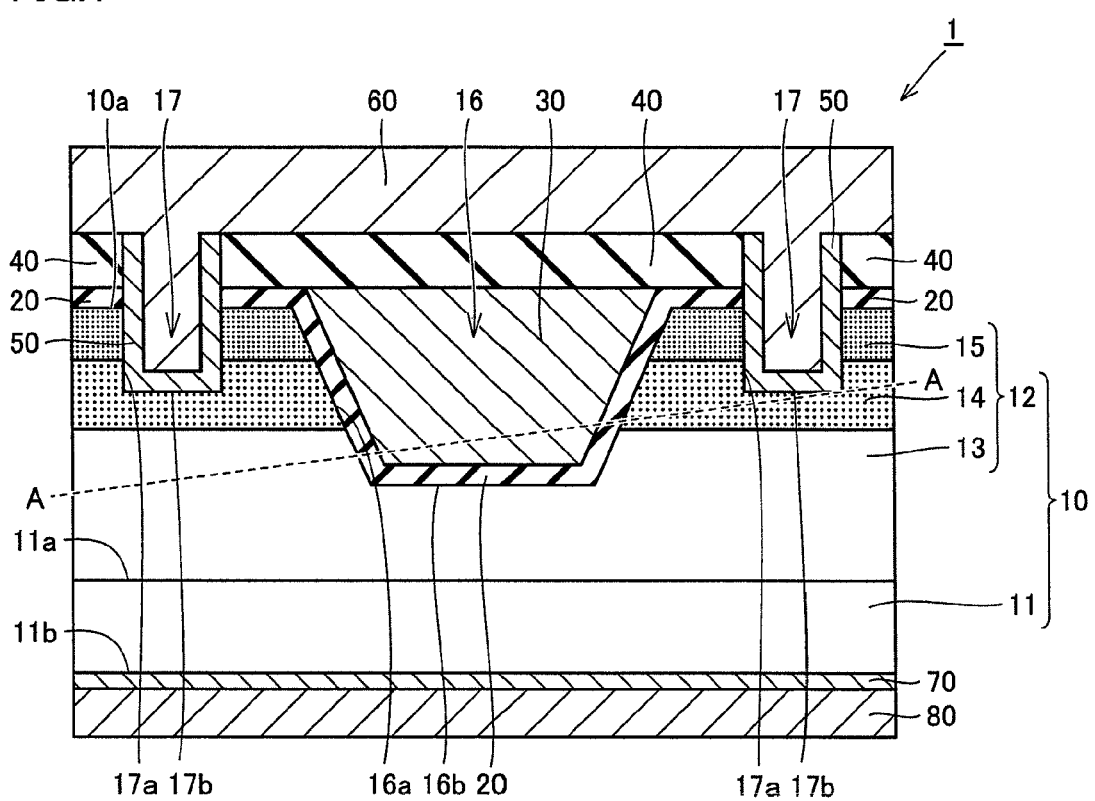
FIG. 1 is a schematic cross sectional view showing a structure of a MOSFET.

The following describes an embodiment of the present invention with reference to figures. It should be noted that in the below-described figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "–" (bar) above a numeral, but is indicated by putting the negative sign before the numeral in the present specification.

First, the following describes a structure of a MOSFET 1 serving as a semiconductor device according to one embodiment of the present invention. Referring to FIG. 1, MOSFET 1 includes: a substrate 10 made of silicon carbide and having a main surface 10a; gate insulating films 20; a gate electrode 30; interlayer insulating films 40; source electrodes 50 each serving as a contact electrode; a source pad electrode 60; a drain electrode 70; and a drain pad electrode 80. Substrate 10 includes a base substrate 11 and a semiconductor layer 12. In semiconductor layer 12, a drift region 13, body regions 14, and source regions 15 are formed. In substrate 10, a first trench 16 is formed to have an opening at the main surface 10a side, and second trenches 17 are each formed to have an opening at the main surface 10a side. Each of second trenches 17 is shallower than first trench 16.

Base substrate 11 is made of silicon carbide, contains an n type impurity such as N (nitrogen), and therefore has n type conductivity. Drift region 13 is formed on a main surface 11a of base substrate 11. As with base substrate 11, drift region 13 contains an n type impurity such as N (nitrogen), and therefore has n type conductivity. The concentration thereof in drift region 13 is lower than that in base substrate 11.

Each of body regions 14 is formed on drift region 13 (at a side opposite to the base substrate 11 side). Body region 14 contains a p type impurity such as Al (aluminum) or B (boron), and therefore has p type conductivity.

Each of source regions 15 is formed on body region 14 (at a side opposite to the drift region 13 side). Source region 15 contains an n type impurity such as P (phosphorus), and therefore has n type conductivity as with base substrate 11 and drift region 13. Further, the concentration of the n type impurity in source region 15 is higher than the concentration thereof in drift region 13.

First trench 16 has wall surfaces 16a and a bottom surface 16b, and is formed to extend through source region 15 and body region 14 and reach drift region 13. Specifically, first trench 16 is formed such that each of wall surfaces 16a is included in source region 15, body region 14, and drift region 13, and such that bottom surface 16b is disposed in drift region 13. Further, each of second trenches 17 has wall surfaces 17a and a bottom surface 17b, and is formed to extend through source region 15 and reach body region 14. Specifically, second trench 17 is formed such that each of wall surfaces 17a is included in source region 15 and body region 14, and such that bottom surface 17b is disposed in body region 14.

Thus, substrate 10 includes: source region 15 including main surface 10a of substrate 10 and wall surface 16a of first trench 16; body region 14 making contact with source region 15 and including wall surface 16a of first trench 16; and drift region 13 making contact with body region 14 and including wall surface 16a of first trench 16.

Gate insulating films 20 are made of, for example, $SiO_2$ (silicon dioxide), and are disposed on and in contact with wall surface 16a and bottom surface 16b of first trench 16 and main surface 10a of substrate 10.

Gate electrode 30 is made of a conductor such as polysilicon having an impurity added therein, for example. Gate electrode 30 is disposed on and in contact with gate insulating film 20 so as to fill first trench 16.

Interlayer insulating film 40 is made of, for example, $SiO_2$ (silicon dioxide), and is disposed on and in contact with gate insulating film 20 and gate electrode 30. Specifically, interlayer insulating film 40 is disposed such that interlayer insulating film 40 and gate insulating film 20 surround gate electrode 30, thus electrically insulating gate electrode 30 from source electrode 50.

Each of source electrodes 50 is disposed on and in contact with wall surface 17a and bottom surface 17b of second trench 17. Specifically, source electrode 50 is made of a material capable of ohmic contact with source region 15, such as $Ni_xSi_y$ (nickel silicide), $Ti_xSi_y$ (titanium silicide), $Al_xSi_y$ (aluminum silicide), or $Ti_xAl_ySi_z$ (titanium aluminum silicide). Source electrode 50 is disposed in contact with source region 15 and body region 14.

Drain electrode 70 is formed on and in contact with a main surface 11b of base substrate 11 opposite to main surface 11a thereof. Drain electrode 70 is made of a material capable of ohmic contact with base substrate 11, such as the same material as that of source electrode 50. Drain electrode 70 is electrically connected to base substrate 11.

Source pad electrode 60 is disposed on and in contact with interlayer insulating film 40 and source electrode 50. Specifically, source pad electrode 60 is made of a conductor such as Al (aluminum), and is electrically connected to source region 15 via source electrode 50.

Drain pad electrode 80 is disposed on and in contact with drain electrode 70. Specifically, as with source pad electrode 60, drain pad electrode 80 is made of a conductor such as Al (aluminum), and is electrically connected to base substrate 11 via drain electrode 70.

The following describes an operation of MOSFET 1 serving as the semiconductor device according to the present embodiment. Referring to FIG. 1, when a voltage is applied between source electrode 50 and drain electrode 70 while an applied voltage to gate electrode 30 is smaller than a threshold voltage, i.e., while it is in OFF state, a pn junction formed between body region 14 and drift region 13 is reverse-biased. Accordingly, MOSFET 1 is in the non-conductive state. Meanwhile, when gate electrode 30 is fed with a voltage equal to or greater than the threshold voltage, carriers are accumulated along wall surface 16a of first trench 16 in body region 14, thereby forming an inversion layer. As a result, source region 15 and drift region 13 are electrically connected to each other, whereby a current flows between source electrode 50 and drain electrode 70. In the manner described above, MOSFET 1 operates.

As described above, in MOSFET 1 serving as the semiconductor device according to the present embodiment, source electrode 50 is disposed on and in contact with wall surface 17a of second trench 17 that extends through source region 15 and that reaches body region 14. Hence, source electrode 50 makes contact with body region 14 via no contact region. Accordingly, in MOSFET 1, holes can be injected from source electrode 50 to body region 14 without influence of a depletion layer extending from a pn junction between source region 15 and the contact region. Accordingly, the operating state of MOSFET 1 can be readily switched, thereby improving response speed of MOSFET 1. Further, in MOSFET 1, second trench 17 is formed to be shallower than first trench 16. Accordingly, in drift region 13 under first trench 16, defects resulting from diffusion of the metal composing source electrode 50 are suppressed from extending, thereby suppressing decrease of breakdown voltage of MOSFET 1. Thus, MOSFET 1 serving as the semiconductor device according to the present embodiment is a semiconductor device in which decrease of breakdown voltage property is suppressed and response speed is improved.

Further, in MOSFET 1, source electrode 50 may be disposed in contact with wall surface 17a and bottom surface 17b of second trench 17 and may be disposed not to be on and in contact with main surface 10a of substrate 10 as shown in FIG. 1.

In this way, a distance between source electrode 50 and gate electrode 30 becomes larger than that in the case where source electrode 50 is disposed on and in contact with main surface 10a of substrate 10. As a result, when a minute MOSFET 1 is formed, short circuit between source electrode 50 and gate electrode 30 can be readily avoided.

Further, in MOSFET 1, wall surface 17a of second trench 17 may be constituted of a plane crossing a {0001} plane.

Substrate 10 made of silicon carbide has such a property that a metal is likely to be diffused in a direction parallel to the {0001} plane. Accordingly, when wall surface 17a of second trench 17 in contact with source electrode 50 is adapted to correspond to the plane crossing the {0001} plane, the metal composing source electrode 50 is facilitated to be diffused into substrate 10, thereby further reducing contact resistance between source electrode 50 and substrate 10.

Further, in MOSFET 1, in a cross section in the thickness direction of substrate 10 including first and second trenches 16, 17, a fictitious straight line A-A extending from wall surface 17a at the lowermost portion of second trench 17 in parallel with the {0001} plane may cross wall surface 16a of first trench 16 facing second trench 17. Specifically, as shown in FIG. 1, straight line A-A may cross wall surface 16a of first trench 16 facing second trench 17, without crossing drift region 13.

Accordingly, the metal composing source electrode 50 can be more effectively suppressed from being diffused into drift region 13, in particular, can be more effectively suppressed from being diffused into drift region 13 below bottom surface 16b of first trench 16. As a result, decrease of breakdown voltage property of MOSFET 1 can be suppressed more effectively.

Further, in MOSFET 1, the plane constituting main surface 10a of substrate 10 may be a plane having an off angle of 8° or smaller relative to the {0001} plane.

Silicon carbide can be readily grown in the <0001> direction. Hence, when the plane constituting main surface 10a of substrate 10 is adapted to have an off angle falling within the above-described range relative to the {0001} plane, substrate 10 made of silicon carbide can be prepared more readily.

Further, in MOSFET 1, wall surface 16a of first trench 16 may form an obtuse angle relative to main surface 10a of substrate 10. Accordingly, a wider region through which carriers pass can be secured between source electrode 50 and drain electrode 70, thereby further reducing on-resistance of MOSFET 1.

Further, in MOSFET 1, the plane constituting wall surface 16a of first trench 16 may be a plane having an off angle of not less than 50° and not more than 65° relative to the {0001} plane. Accordingly, channel mobility of MOSFET 1 can be improved more.

Further, in MOSFET 1, body region 14 may have a p type impurity concentration of $1.0 \times 10^{17}$ cm$^{-3}$ or greater. In this way, contact resistance between source electrode 50 and body region 14 can be further reduced. Further, body region 14 may have a p type impurity concentration of $5.0 \times 10^{18}$ cm$^{-3}$ or smaller. Thus, the impurity concentration in body region 14 can be set to fall within a range with which decrease of crystallinity of substrate 10 made of silicon carbide can be avoided.

Further, in MOSFET 1, source electrode 50 is connected to body region 14 via no contact region. Hence, a step of forming the contact region can be omitted, thereby achieving more efficient manufacturing process. Further, as described above, in the case where the plane having an off angle falling within the above-described range relative to the {0001} plane is employed as the plane constituting wall surface 16a of first trench 16, a trade-off relation between the impurity concentration in the body region and the channel mobility in MOSFET 1 becomes small. Accordingly, decrease of channel mobility in MOSFET 1 can be suppressed even in the case where body region 14 has a p type impurity concentration falling within the above-described range.

Figure 2:
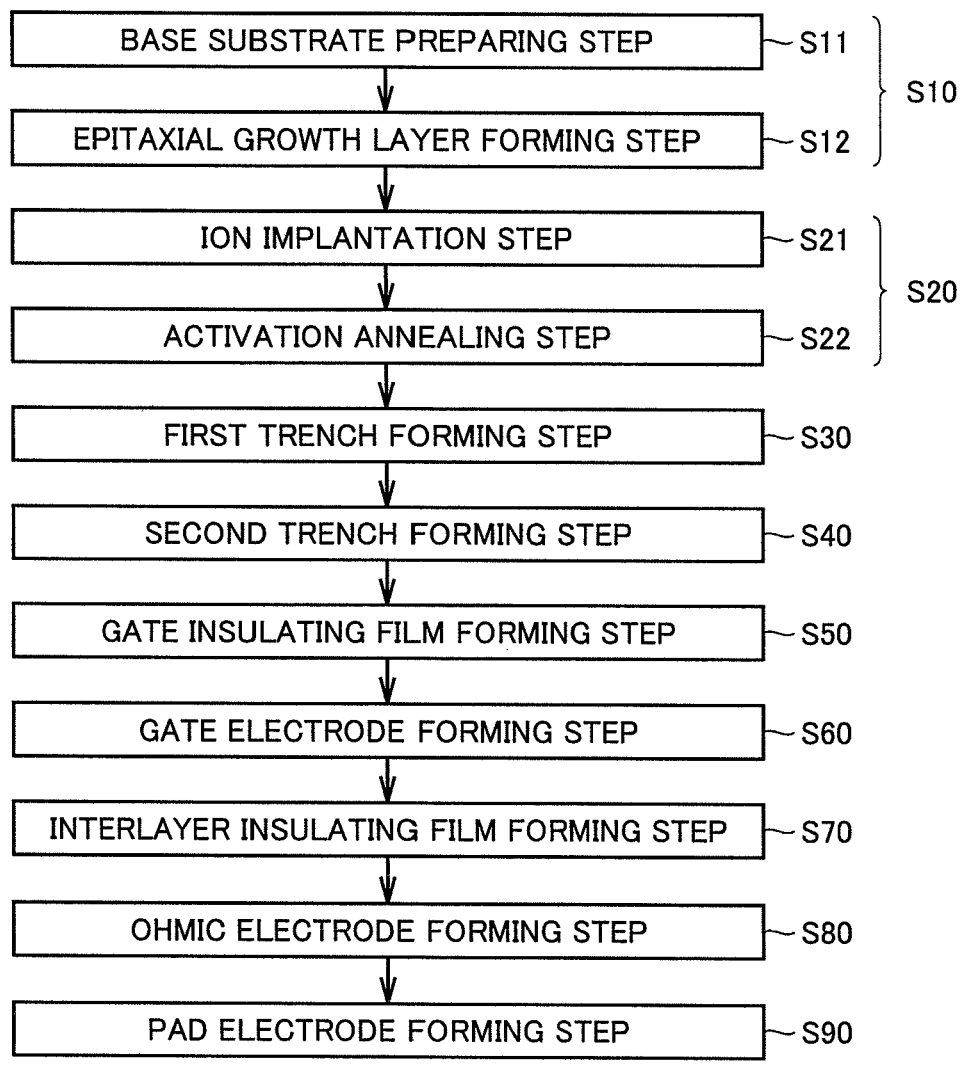
FIG. 2 is a flowchart schematically showing a method for manufacturing the MOSFET.

The following describes a method for manufacturing the semiconductor device in one embodiment of the present invention. In the method for manufacturing the semiconductor device in the present embodiment, MOSFET 1 serving as the semiconductor device according to the present embodiment can be manufactured. Referring to FIG. 2, first, a substrate preparing step is performed as step (S10). In this step (S10), steps (S11) and (S12) described below are performed to prepare substrate 10 made of silicon carbide.

First, as step (S11), a base substrate preparing step is performed. In this step (S11), an ingot (not shown) made of, for example, 4H—SiC is sliced to prepare base substrate 11 made of silicon carbide as shown in FIG. 3.

Next, as step (S12), an epitaxial growth layer forming step is performed. In this step (S12), referring to FIG. 3, semiconductor layer 12 is formed by epitaxial growth on main surface 11a of base substrate 11. In this way, there is prepared substrate 10 including base substrate 11 and semiconductor layer 12 and having main surface 10a.

Next, as a step (S20), an active region forming step is performed. In this step (S20), steps (S21) and (S22) described below are performed to form an active region in substrate 10. First, as step (S21), an ion implantation step is performed. In this step (S21), referring to FIG. 4, for example, Al (aluminum) ions are first implanted into semiconductor layer 12, thereby forming body region 14 of p type conductivity. Next, for example, P (phosphorus) ions are implanted into semiconductor layer 12 to a depth shallower than the depth to which the Al ions have been implanted, thereby forming source region 15 of n type conductivity. Further, in semiconductor layer 12, a region in which neither of body region 14 and source region 15 is formed serves as drift region 13. In this way, source region 15 including main surface 10a of substrate 10, body region 14 making contact with source region 15, and drift region 13 making contact with body region 14 are formed in semiconductor layer 12.

Next, as step (S22), an activation annealing step is performed. In this step (S22), by heating substrate 10, the impurities implanted in step (S21) are activated. Accordingly, desired carriers are generated in the regions having the impurities implanted therein. In this way, the active region is formed in substrate 10.

Figure 6:
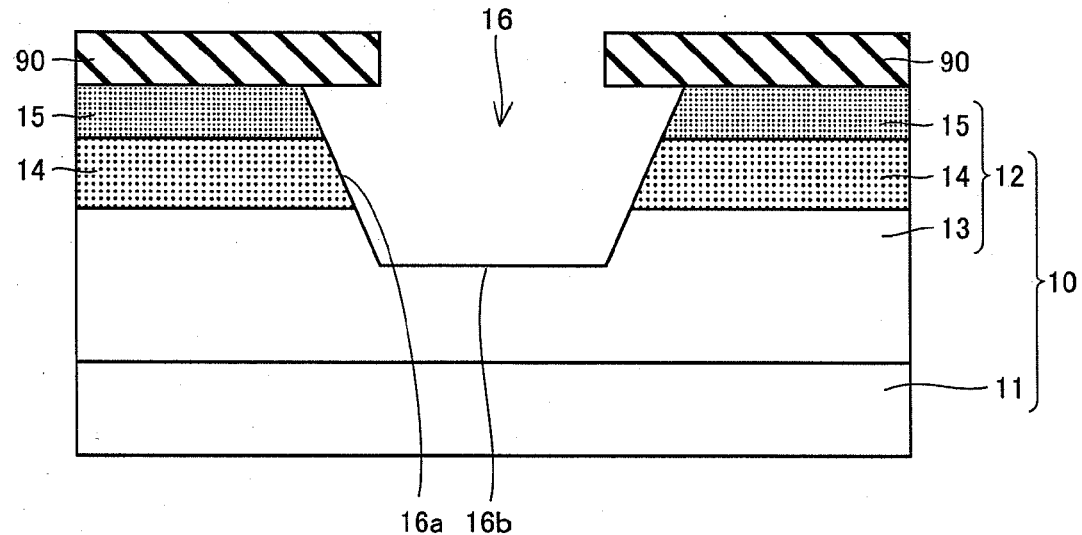
FIG. 6 is a schematic cross sectional view for illustrating the method for manufacturing the MOSFET.

Next, as a step (S30), a first trench forming step is performed. In this step (S30), referring to FIG. 5 and FIG. 6, first trench 16 is formed in substrate 10 to have its opening at the main surface 10a side and have wall surface 16a and bottom surface 16b. Specifically, for example, referring to FIG. 5, first, a P-CVD (Plasma-Chemical Vapor Deposition) method is employed to form a mask 90 having an opening in conformity with a region of main surface 10a in which first trench 16 is to be formed. Mask 90 is made of SiO$_2$ (silicon dioxide). Next, for example, in an atmosphere containing SF$_6$ (sulfur hexafluoride) gas and oxygen, substrate 10 is etched in a direction indicated by arrows in the figure by means of Inductive Coupled Plasma Reactive Ion Etching (ICP-RIE) or the like. Next, referring to FIG. 6, for example, thermal etching is performed in an atmosphere containing oxygen and a halogen-based gas such as chlorine. After completion of the etching process, mask 90 is removed. In this way, first trench 16 having wall surface 16a and bottom surface 16b is formed to extend through source region 15 and body region 14, reach drift region 13, and expose source region 15, body region 14, and drift region 13.

Figure 7:
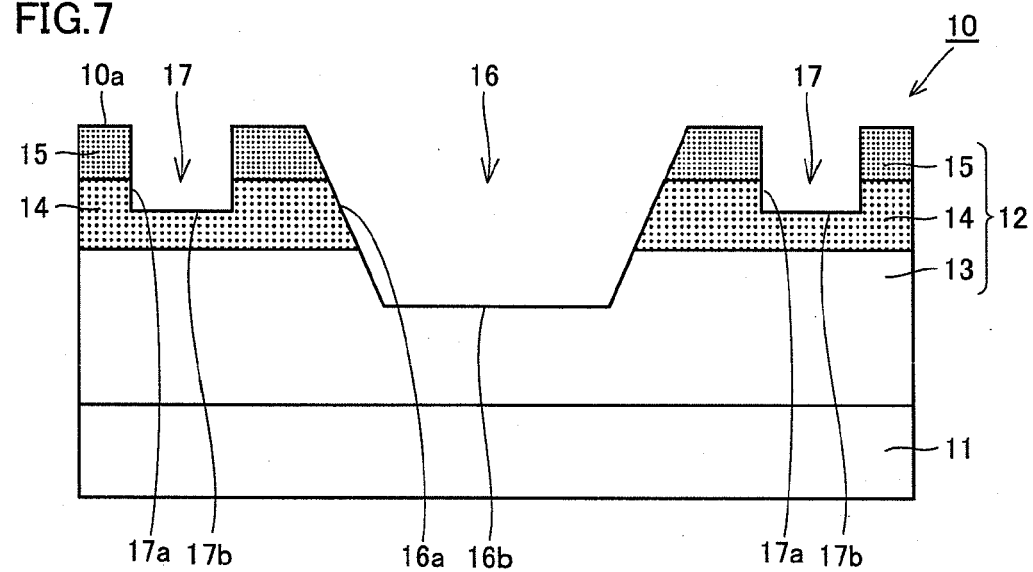
FIG. 7 is a schematic cross sectional view for illustrating the method for manufacturing the MOSFET.

Next, as a step (S40), a second trench forming step is performed. In this step (S40), referring to FIG. 7, as with step (S30) described above, substrate 10 is etched, whereby second trench 17 having wall surface 17a and bottom surface 17b is formed to extend through source region 15, reach body region 14, and expose source region 15 and body region 14.

Next, as a step (S50), a gate insulating film forming step is performed. In this step (S50), referring to FIG. 8, for example, by heating substrate 10 in an atmosphere containing oxygen, gate insulating film 20 made of SiO$_2$ (silicon dioxide) is formed to cover main surface 10a of substrate 10, wall surface 16a and bottom surface 16b of first trench 16, and wall surface 17a and bottom surface 17b of second trench 17.

Next, as a step (S60), a gate electrode forming step is performed. In this step (S60), referring to FIG. 9, for example, an LP (Low Pressure) CVD method is employed to form a polysilicon film having an impurity added therein, so as to fill first trench 16. In this way, gate electrode 30 is formed on and in contact with gate insulating film 20.

Figure 10:
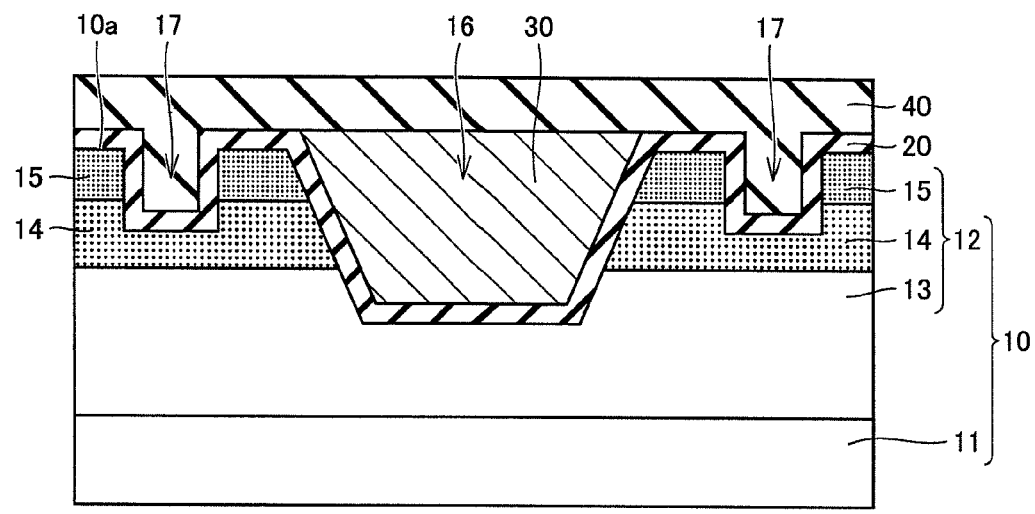
FIG. 10 is a schematic cross sectional view for illustrating the method for manufacturing the MOSFET.

Next, as a step (S70), an interlayer insulating film forming step is performed. In this step (S70), referring to FIG. 10, for example, the CVD method is employed to form interlayer insulating film 40 made of SiO$_2$ (silicon dioxide) such that interlayer insulating film 40 and gate insulating film 20 surround gate electrode 30.

Figure 11:
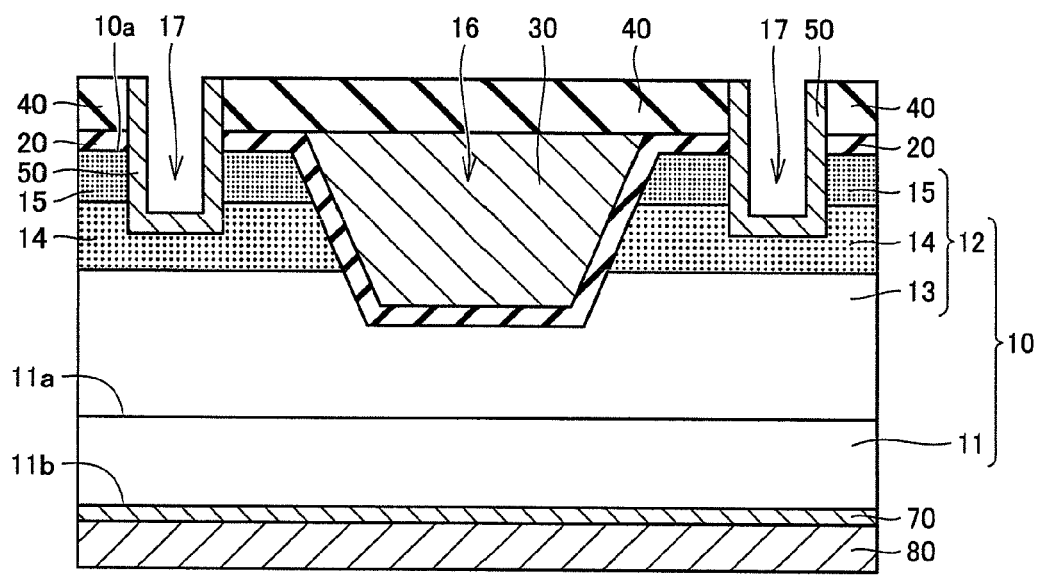
FIG. 11 is a schematic cross sectional view for illustrating the method for manufacturing the MOSFET.

Next, as a step (S80), an ohmic electrode forming step is performed. In this step (S80), referring to FIG. 11, first, interlayer insulating film 40 and gate insulating film 20 are removed from the region in which source electrode 50 is to be formed, thereby forming a region in which source region 15 and body region 14 are exposed. Then, in this region, a metal film made of Ni is formed, for example. Likewise, a metal film made of Ni is formed on main surface 11b of base substrate 11 opposite to main surface 11a thereof. Then, by heating the metal films, at least portions of the metal films are silicided, thereby forming source electrode 50 and drain electrode 70 electrically connected to substrate 10.

Next, as a step (S90), a pad electrode forming step is performed. In this step (S90), referring to FIG. 1, for example, a deposition method is employed to form source pad electrode 60, which is made of a conductor such as Al (aluminum), so as to cover source electrode 50 and interlayer insulating film 40. Further, as with source pad electrode 60, for example, the deposition method is employed to form, on drain electrode 70, drain pad electrode 80 made of a conductor such as Al (aluminum). By performing steps (S10) to (S90) described above, MOSFET 1 is manufactured, thus completing the method for manufacturing the semiconductor device in the present embodiment. Thus, in the method for manufacturing the semiconductor device according to the present embodiment, there can be manufactured MOSFET 1 which serves as the semiconductor device according to the present embodiment and in which decrease of breakdown voltage property is suppressed and the property is improved.

Further, in the present embodiment, it has been only illustrated that first and second trenches 16, 17 respectively have bottom surfaces 16b, 17b, but the semiconductor device of the present invention and the method for manufacturing the semiconductor device are not limited to this. For example, the semiconductor device and the method for manufacturing the semiconductor device in the present invention can be also employed for a MOSFET having V-shaped first and second trenches each having no bottom surface, as well as a method for manufacturing such a MOSFET.

Further, in the present embodiment, only the MOSFET and the method for manufacturing the MOSFET have been illustrated, but the semiconductor device and the method for manufacturing the semiconductor device in the present invention are not limited to these. For example, the semiconductor device and the method for manufacturing the semiconductor device in the present invention can be also employed for a semiconductor device, such as an IGBT (Insulated Gate Bipolar Transistor), which is required to suppress decrease of breakdown voltage property and improve response speed, as well as a method for manufacturing such a semiconductor device.

The semiconductor device and the method for manufacturing the semiconductor device in the present invention can be particularly advantageously applied to a semiconductor device, which is required to suppress decrease of breakdown voltage property and improve device property, as well as a method for manufacturing such a semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a substrate made of silicon carbide and having a first trench and a second trench formed therein, said first trench having an opening at a side of one main surface, said second trench having an opening at the side of said main surface and being shallower than said first trench;
a gate insulating film disposed on and in contact with a wall surface of said first trench;
a gate electrode disposed on and in contact with said gate insulating film; and
a contact electrode disposed on and in contact with a wall surface of said second trench,
said substrate including
a source region including said main surface of said substrate and said wall surface of said first trench,
a body region making contact with said source region and including said wall surface of said first trench, and
a drift region making contact with said body region and including said wall surface of said first trench,
said first trench being formed to extend through said source region and said body region and reach said drift region,
said second trench being formed to extend through said source region and reach said body region.

2. The semiconductor device according to claim 1, wherein said contact electrode is disposed not to be on and in contact with said main surface of said substrate.

3. The semiconductor device according to claim 1, wherein said wall surface of said second trench is constituted of a plane crossing a {0001} plane.

4. The semiconductor device according to claim 1, wherein in a cross section in a thickness direction of said substrate including said first and second trenches, a fictitious straight line (A-A) extending from said wall surface at a lowermost portion of said second trench in parallel with a {0001} plane crosses said wall surface of said first trench facing said second trench.

5. The semiconductor device according to claim 4, wherein in the cross section in the thickness direction of said substrate including said first and second trenches, said fictitious straight line (A-A) crosses said wall surface of said first trench facing said second trench, without crossing said drift region.

6. The semiconductor device according to claim 1, wherein said main surface of said substrate is constituted of a plane having an off angle of 8° or smaller relative to a {0001} plane.

7. The semiconductor device according to claim 1, wherein said wall surface of said first trench forms an obtuse angle relative to said main surface of said substrate.

8. The semiconductor device according to claim 1, wherein said wall surface of said first trench is constituted of a plane having an off angle of not less than 50° and not more than 65° relative to a {0001} plane.

9. The semiconductor device according to claim 1, wherein said body region has an impurity concentration of not less than $1.0 \times 10^{17}$ cm$^{-3}$ and not more than $5.0 \times 10^{18}$ cm$^{-3}$.

* * * * *